United States Patent [19]

Peterson

[11] 4,156,853

[45] May 29, 1979

[54] ACTIVE FILTER FOR PROVIDING IMPROVED NOTCH AND BAND PASS FILTERS

[75] Inventor: Robert S. Peterson, Williamsville, N.Y.

[73] Assignee: Westinghouse Electric Corp., Pittsburgh, Pa.

[21] Appl. No.: 876,307

[22] Filed: Feb. 9, 1978

[51] Int. Cl.² ............................................. H03F 1/36
[52] U.S. Cl. ..................................... 330/109; 330/85; 330/108
[58] Field of Search .................. 330/85, 103, 107, 108, 330/109, 303

[56] References Cited

U.S. PATENT DOCUMENTS 3,356,962   12/1967   Morgan ............................ 330/108 X Primary Examiner—Lawrence J. Dahl
Attorney, Agent, or Firm—James J. Wood

[57] ABSTRACT

An active filter is disclosed for providing improved notch and band pass filters. The output to input frequency response of an active filter is mathematically expressed as a ratio of two polynominals in the Laplace operator S. In any notch filter, the coefficient of the S term in the numerator must be reduced to zero, while in any band pass arrangement the coefficient of the S term in the denominator is reduced to zero. The improved notch filter provides an input circuit for the operational amplifier portion of the filter which eliminates the S term in the numerator so that adjustments to reduce this term are unnecessary. Similarly, in the improved band pass filter, the S term in the denominator is eliminated in the feedback circuit provided for the operational amplifier, so that adjustment is unnecessary to eliminate the coefficient of S.

4 Claims, 4 Drawing Figures

IDEAL NOTCH FILTER TRANSFER FUNCTION $$\frac{(R_1 C_1)^2 s^2 + 1}{(R_1 C_1)^2 s^2 + R_1 C_1 s + 1}$$

ACTIVE FILTER FOR PROVIDING IMPROVED NOTCH AND BAND PASS FILTERS

BACKGROUND OF THE INVENTION

1. Field of the Invention

This invention relates to an active filter adaptable to be utilized either as a notch filter or as a band pass filter.

2. Description of the Prior Art

Active filters were first introduced in the thirties, but they provided relatively little competition vis-à-vis the passive LC filters then in use. The competitive advantage resided with the passive filters by reason of the fact that the active filters were required to use vacuum tubes as gain elements which resulted in a configuration which was both cumbersome as well as short lived.

All this was changed with the introduction of the transistor and the accelerated development which followed in solid state electronics both as regards reliability as well as miniaturzation.

One of the best discussions of active filters can be found in the treatise *Active Filter Design* by Arthur B. Williams published by Artech House Inc. 610 Washington St., Dedham, Mass. 02026, Copyright 1975. Another excellent discussion of active filters may be found in *Operational Amplifiers* by Jerald G. Graeme, Gene E. Tobey and Lawrence P. Huelsman published by McGraw-Hill copyright 1971 (See pages 282-326).

The difficulty with prior art active filters has been the problem of adjusting commercially available components to achieve a desired frequency response. The problem is stated in *Active Filter Design* by Arthur B. Williams at page 3:

"A major disadvantage of Active Filters has been the lack of adjustment capability, thus placing the Frequency Response at the mercy of component tolerances whereas passive filters have tunable Inductors".

SUMMARY OF THE INVENTION

An active filter is claimed which is adaptable for use either as a notch filter or bandpass filter. For its gain element the active filter uses an operational amplifier in both cases. In the notch filter adaptation, input circuit means for the operational amplifier insure that the transfer function of frequency response has a numerator in the form $(R_xC_x)^2S^2+1$ with no possibility for the introduction of the S term in the numerator by a maladjustment of the components. In the band pass filter adaptation the feedback circuit means for the operational amplifier insures that the transfer function has a denominator in the form of $(R_xC_x)^2S^2+1$ with no possibility for the introduction of the S term in the denominator.

ENVIRONMENTAL BACKGROUND OF THE PRESENT INVENTION

In bar mills, operating in the pouring reel mode, torsional vibrations in the drive gearing present a perennial problem. During wobble, the drive speed has a sawtooth-type small speed variation around an operating speed that follows the mill speed, thus permitting proper coiling of the bar on the pouring reel. In order to obtain the sawtooth speed variations, a digital computer, which controls the pouring reel operation, provides a variation in the drive speed regulator speed reference, calculates the armature current requirement, and provides an armature current reference signal to the inner armature current controller of the multiloop speed regulator, so that the drive armature current goes through a very fast current reversal at the knee of the sawtooth speed variation cycle. This rapid change in armature current reversal perturbs the mechanical system causing an armature current oscillation frequency of 17 Hertz. The drive speed regulator amplifies the drive speed torsional variation which may be observed in the tachometer output voltage, and in turn, this causes the drive armature current to have an increase in magnitude of 17 Hertz current oscillation, which further causes more mechanical system vibration. In order to prevent this resonant effect, the torsional vibration noise coming out of the speed controller had to be filtered before it gets to the inner armature current controller. The same results may also be obtained by filtering the tachometer voltage signal to the speed controller. In order to provide a fast speed regulator which is required to obtain the sawtooth speed variation, a sharp notch filter is required, which primarily only filters (attenuates) the torsional vibration frequency and passes, without attenuation, lower and higher frequencies around the torsional frequency.

A new notch active filter is provided which can be calibrated to the torsional vibration frequency by calculated potentiometer settings. With the notch filter of the invention, it is not necessary to tune this notch filter in a laboratory using sophisticated electronic equipment such as a frequency analyzer for example.

DESCRIPTION OF PREFERRED EMBODIMENTS

Figure 3:
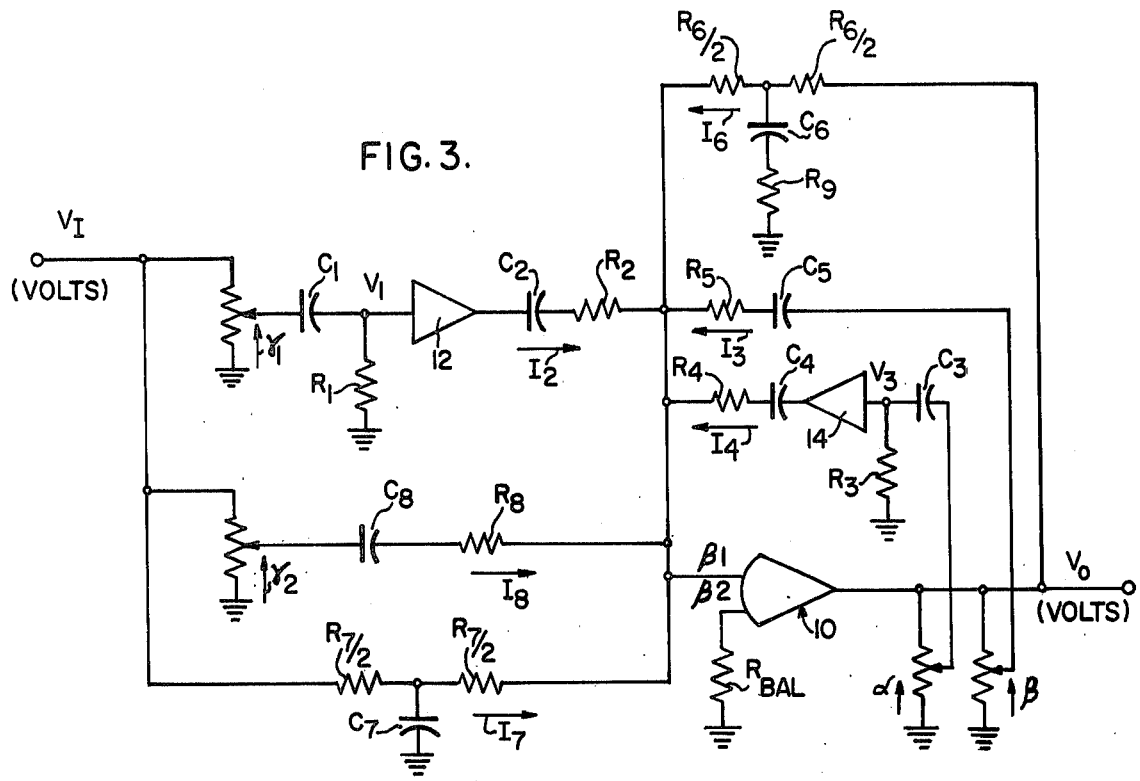
FIG. 3 is a schematic diagram used in deriving the basic mathematical equations.

Referring first to FIG. 3, there is shown a complex poles and zeroes active filter which may be adapted to provide a notch filter or a band pass filter.

The active filter comprises an operational amplifier indicated generally at 10 and emitter followers indicated symbolically at 12 and 14. The remaining components of the filter comprise capacitors, resistors and potentiometers identified at: 24, 26, 32, 34, 36, 42; 28, 30, 38, 40; 18, 20, 22, respectively.

Let s=the Laplace operator and $\gamma_1$, $\gamma_2$, $\alpha$ and $\beta$ are per unit (P.U.) potentiometer settings. The input voltage $V_1$ is:

$$(1)\ V_1 = (\gamma_1 V_I)\left[\frac{R_1C_1S}{R_1C_1S+1}\right]$$

$$(2)\ I_2 = \frac{V_1}{R_2 + \frac{1}{C_2S}} = \left[\frac{C_2S}{R_2C_2S+1}\right]V_1 =$$

$$(\gamma_1 V_I)\left[\frac{R_1C_1S}{R_1C_1S+1}\right]\left[\frac{C_2S}{R_2C_2S+1}\right]$$

$$(3)\ I_8 = (\gamma_2 V_I) \left[ \frac{1}{R_8 + \frac{1}{C_8 S}} \right] = \left[ \frac{C_8 S}{R_8 C_8 S + 1} \right] (\delta_2 V_I)$$

$$(4)\ I_7 = \left( \frac{V_I}{R_7} \right) \left[ \frac{1}{1 + \left(\frac{R_7}{4}\right) C_7 S} \right]$$

$I_I$ = the total input current to the operational amplifier 10. Therefore:

$$(5)\ I_I = I_2 + I_8 + I_7$$

$$(6)\ I_I = \left\{ \left[ \frac{R_1 C_1 S}{R_1 C_1 S + 1} \right] \left[ \frac{C_2 S}{R_2 C_2 S + 1} \right] \gamma_1 + \left[ \frac{C_8 S}{R_8 C_8 S + 1} \right] \gamma_2 + \frac{1}{R_7 \left( 1 + \frac{R_4}{4} C_7 S \right)} \right\} V_I$$

(7) Let $R_1 C_1 = R_8 C_8 = R_4 C_7 / 4 = T_m$ seconds, and neglect $R_2 C_2$ which is very small.

$$(8)\ \therefore I_I = \left\{ \frac{\gamma_1 (R_1 C_1)(R_7 C_2) S^2 + \gamma_2 (R_7 C_8) S + 1}{R_7 [T_m S + 1]} \right\} V_I$$

(9) Since $Z_I = V_I / I_I$, Input impedance of operational amplifier 10 The input impedance to the operational amplifier 10 is:

$$(10)\ Z_I = \frac{R_7 [T_m S + 1]}{\gamma_1 (R_1 C_1)(R_7 C_2) S^2 + \gamma_2 (R_7 C_8) S + 1}$$

$$(11)\ V_3 = (\alpha V_0) \left[ \frac{R_3}{R_3 + \frac{1}{C_3 S}} \right] = \left[ \frac{R_3 C_3 S}{R_3 C_3 S + 1} \right] (\alpha V_0)$$

$$(12)\ I_4 = \frac{V_3}{R_4 + \frac{1}{C_4 S}} = \left[ \frac{C_4 S}{R_4 C_4 S + 1} \right] V_3 = \left[ \frac{R_3 C_3 S}{R_3 C_3 S + 1} \right] \left[ \frac{C_4 S}{R_4 C_4 S + 1} \right] (\alpha V_0)$$

$$(13)\ I_5 = \frac{\beta V_0}{R_s + \frac{1}{C_5 S}} = \left[ \frac{C_5 S}{R_5 C_5 S + 1} \right] (\beta V_0)$$

$$(14)\ I_6 = \left( \frac{V_0}{R_6} \right) \left[ \frac{1}{1 + \frac{R_6}{4} C_6 S} \right]$$

The total feedback current $I_F$ to the operational amplifier 10 is:

$$(15)\ I_F = I_4 + I_5 + I_6$$

$$(16)\ I_F = \left\{ \left[ \frac{C_4 S}{R_4 C_4 S + 1} \right] \left[ \frac{R_3 C_3 S}{R_3 C_3 S + 1} \right] \alpha + \left[ \frac{C_5 S}{R_5 C_5 S + 1} \right] \beta + \left[ \frac{1}{R_6 \left[ 1 + \left(\frac{R_6}{4}\right) C_6 S \right]} \right] \right\} V_0$$

Let $R_4 C_4 = R_5 C_R = (R_6/4) C_6 = T_5$ secs, and neglect $R_3 C_3$ which is very small.

$$(17)\ \therefore I_F = \left[ \frac{\alpha (R_6 C_4)(R_3 C_3) S^2 + \beta (R_6 C_5) S + 1}{R_6 (T_5 S + 1)} \right] V_0$$

The feedback impedance Zf of the operational amplifier 10 is:

$$(18)\ Z_F = (V_0 / I_F)$$

$$(19)\ Z_F = \frac{R_6 (T_5 S + 1)}{\alpha (R_6 C_4)(R_3 C_3) S^2 + \beta (R_6 C_5) S + 1}$$

Since
$$(20)\ (V_0 / V_I) = (-Z_f / Z_I)$$

Equation (19) may be written as:

$$(21)\ = \frac{\dfrac{R_6 [T_5 S + 1]}{-\alpha (R_6 C_4)(R_3 C_3) S^2 + \beta (R_6 C_5) S + 1}}{\dfrac{R_7 [T_m S + 1]}{\gamma_1 (R_1 C_1)(R_7 C_2) S^2 + \gamma_2 (R_7 C_8) S + 1}}$$

Let $T_5 = T_m$, and the transfer function for the active filter becomes:

$$(22)\ \frac{V_o}{V_I} = \frac{-\gamma_1 (R_1 C_1)(R_7 C_2) S^2 + \gamma_2 (R_7 C_8) S + 1}{\alpha (R_6 C_4)(R_3 C_3) S^2 + \beta (R_6 C_5) S + 1}$$

The function of a filter is to produce an output to input frequency response. The transfer function (equation 22) mathematically expresses this response as a ratio of two polynominals in the operator S. The roots of the numerator polynominal are called zeros, and the roots of the denominator polynominal are called poles.

An ideal notch filter is an active filter which infinitely attenuates one frequency and passes all others. An ideal band pass filter on the other hand is an active filter which passes only one frequency and infinitely attenuates all others. Obviously, in a practical embodiment these conditions can only be approximately realized.

Equation 22 can be arranged in more general terms. Let $\omega_n$ be the break frequency in radians/sec. $\vartheta$ = the damping factor, and the subscripts 1 and 2 are for the numerator and denominator respectively. Then $$(23)\ \frac{V_o}{V_I} = \frac{-\dfrac{S^2}{(\omega_{n1})^2} + \left( \dfrac{2\vartheta_1}{\omega_{n1}} \right) S + 1}{\dfrac{S^2}{(\omega_{n2})^2} + \left( \dfrac{2\vartheta_2}{\omega_{n2}} \right) S + 1}$$

where $$\omega_{n1} = \left( \frac{1}{\sqrt{\gamma_1}} \right) \left( \frac{1}{\sqrt{(R_1 C_1)(R_7 C_2)}} \right) =$$

zero Resonant Frequency Rad/sec

-continued $$\xi_1 = \left(\frac{\gamma_2}{2\sqrt{\gamma_1}}\right)\left(\frac{R_7C_8}{\sqrt{(R_1C_1)(R_7C_2)}}\right) = \text{zero damping}$$

$$\omega_{n2} = \left(\frac{1}{\sqrt{\alpha}}\right)\left(\frac{1}{\sqrt{(R_6C_4)(R_3C_3)}}\right) =$$

pole resonant frequency Rad/sec $$\xi_2 = \left(\frac{\beta}{2\sqrt{\alpha}}\right)\left(\frac{R_6C_5}{\sqrt{(R_6C_4)(R_3C_3)}}\right) = \text{pole damping}$$

In order for the active filter of FIG. 3, to be a notch filter, the s term in the numerator is made equal to zero. In order for the active filter of FIG. 3, to serve as a pass band filter, the s term in the denominator is made equal to zero. Let

(24) $C_1 = C_3$; $C_2 = C_4$; $C_5 = C_8 R_1 = R_3$; $R_2 = R_4$; $R_5 = R_8$; $R_6 = R_7$ $$(25) \therefore \frac{V_o}{V_I} = \frac{\gamma_1(R_1C_1)(R_6C_2)S^2 + \gamma_2(R_6C_5)S + 1}{\alpha(R_1C_1)(R_6C_2)S^2 + \beta(R_6C_5)S + 1}$$

For a Notch Filter

Make
$\alpha = \gamma_1 = \beta$
$\xi_1 = 0$  $\xi_2 = 0.5$ (commonly used for Bridge -T filters
$\gamma_2 = 0$ since $\xi_1 = 0$
$R_1C_1 \cong R_6C_2$
$1.44\ R_1C_1 = R_6C_6$ $$(26) \frac{V_o}{V_I} = \frac{\alpha(R_1C_1)^2 S^2 + 1}{\alpha(R_1C_1)^2 S^2 + \beta(R_6C_5)S + 1}; \text{notch filter}$$

$$(27)\ \omega_n = \frac{1}{\sqrt{\alpha}\ R_1C_1}\quad \xi_2 = .5$$

$$(28) \frac{2\xi_2}{\omega_n} = 2\sqrt{\alpha}\ (.5)(R_1C_1) = \beta(R_6C_5)$$

Figure 4:
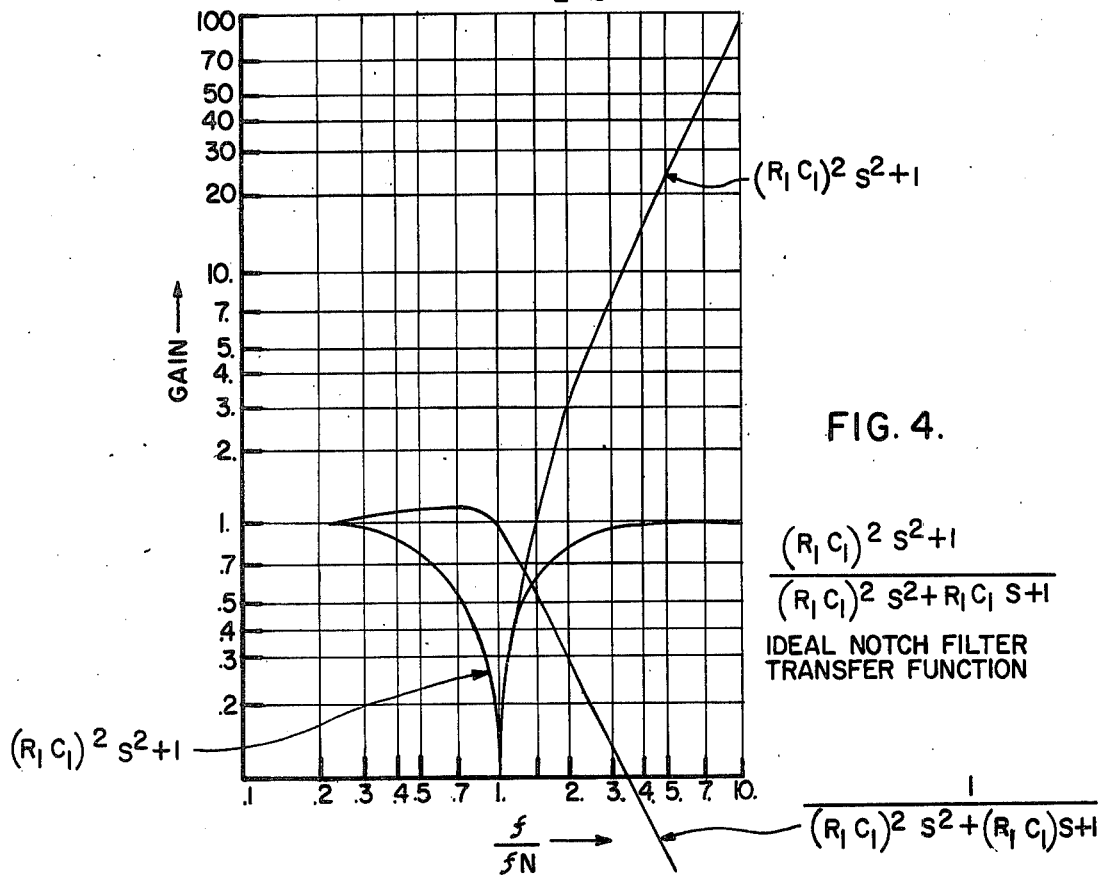
FIG. 4 is a gain vs. frequency plot of an ideal notch filter plot on a log-log scale.

(29) $\sqrt{\alpha}(R_1C_1) = \beta(R_6C_5)$
(31) $\sqrt{\alpha} = \beta(1.44)$
(32) $\sqrt{\alpha} = \beta$; for notch filter when $R_6C_5 = R_1C_1$
(33) $\beta = \sqrt{\alpha}/1.44 = 0.6944\sqrt{\alpha}$ when $R_6C_5 = 1.44\ R_1C_1$
(34) $0.4\ N(4P) = 0.6944\sqrt{0.481\ 3P}$
(35) $4P = \sqrt{3P}$; per unit
(36) % 4P setting $- 10.\sqrt{\% \xi P \text{ setting}}$ The gain Vs frequency curve for the idealized notch filter with $\xi = 0.5$ is shown in FIG. 4. The contributions of the numerator $(R_1C_1)^2S^2 + 1$, and the denominator $$\frac{1}{(R_1C_1)^2 S + (R_1C_1)S + 1},$$

are indicated by lighter lines with the heavier line indicating the curve for the resulting notch filter.

Figure 1:
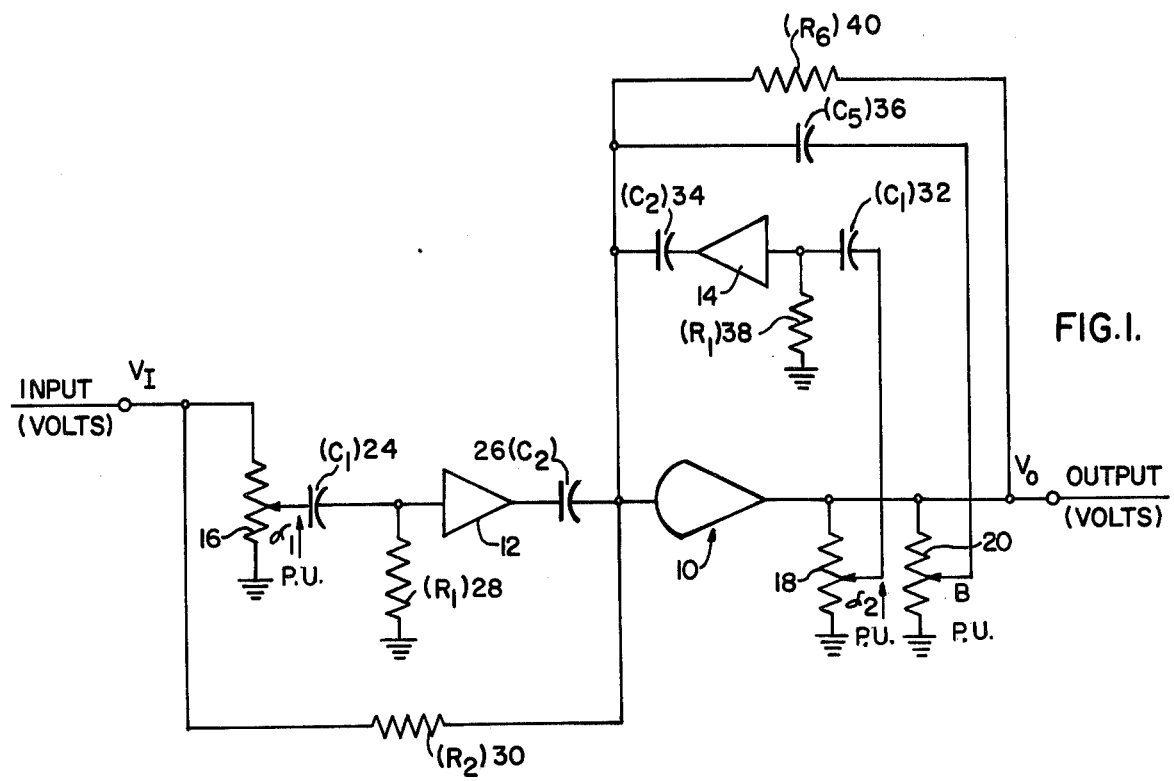
FIG. 1 is a schematic diagram of an active filter adapted as a notch filter in accordance with the invention.

The notch filter can be further simplified by eliminating the small filters to produce the configuration of FIG. 1. The mathematics can be further simplified as follows:

Let $C_2R_2 = C_1R_6 = C_xR_x$; $\alpha_1 = \alpha_2 = \alpha$
The transfer function then may be written:

$$(37) \frac{V_o}{V_I} = \frac{\alpha(R_xC_x)^2 S^2 + 1}{\alpha(R_xC_x)^2 S^2 + \beta(R_6C_5)S + 1}$$

Note that $\alpha$ is the P.U. (per unit) setting of both potentiometer 16 and potentiometer 18.
The notch frequency $\omega_m$ is:

$$(38)\ \omega_m = \frac{1}{\sqrt{\alpha}\ (R_xC_x)}$$

Some further useful relationship can be derived $$(39)\ \frac{2\xi_2}{\omega_m} = \beta(R_6C_5)$$

The damping factor $\xi_2$ is $$(40)\ \xi_2 = \frac{1}{2}\omega_m\beta R_6C_5$$

$$(41)\ \xi_2 = \frac{1}{2}\ \frac{\beta}{\sqrt{\alpha}}\ \frac{(R_6C_5)}{(R_xC_x)}$$

For an idealized notch 0.5 is considered to be the value for the damping factor $$(42)\ \therefore \frac{\beta}{\sqrt{\alpha}} = \frac{R_xC_x}{R_6C_5}$$

(43) $\omega_m = 2\pi f_m$ $$(44)\ f_m = \frac{1}{2\pi\sqrt{\alpha}\ (R_xC_x)}$$

In practice, once the troublesome frequency is determined, the circuit values are then calculated using the formulae of equations (37) to (44). Potentiometers 16 and 18 have the same PU setting.

The notch filter of FIG. 1 requires three potentiometer settings which conform closely with the calculated values. Referring to equation (37) the setting $\alpha_1$ of potentiometer 16 adjusts the coefficient of the $S^2$ term in the numerator. The setting $\alpha_2$ of potentiometer 18 adjusts the coefficient of the $S^2$ term in the denominator, and the setting $\beta$ of potentiometer 20 adjusts the coefficient of the S term in the denominator.

The prior art notch filters primarily use a resistor-capacitor network to generate the transfer function, so that the elimination of the lead quadratic zero damping coefficient depends upon the rheostat settings of the network; these adjustments are critical and require sophisticated electronic equipment. A slight misadjustment of one rheostat and the notch filtering either disappears, or the notch appears at the wrong frequency.

The input circuit to the operational amplifier 10 of the notch filter of FIG. 1 inherently eliminates the S term i.e. provides zero damping. There is thus no way that the lead quadratic zero (the quadratic zero located in the numerator of the transfer function) can have damping.

The notch filter of FIG. 1 conforms closely to the calculated value. Tests have indicated that only a slight improvement is achieved by finely adjusting the potentiometer 16 which determines the coefficient of the $S^2$ term in the numerator of the transfer function. Further, no significant change was observed in adjusting potentiometer 18 and 20 about their calculated settings.

Figure 2:
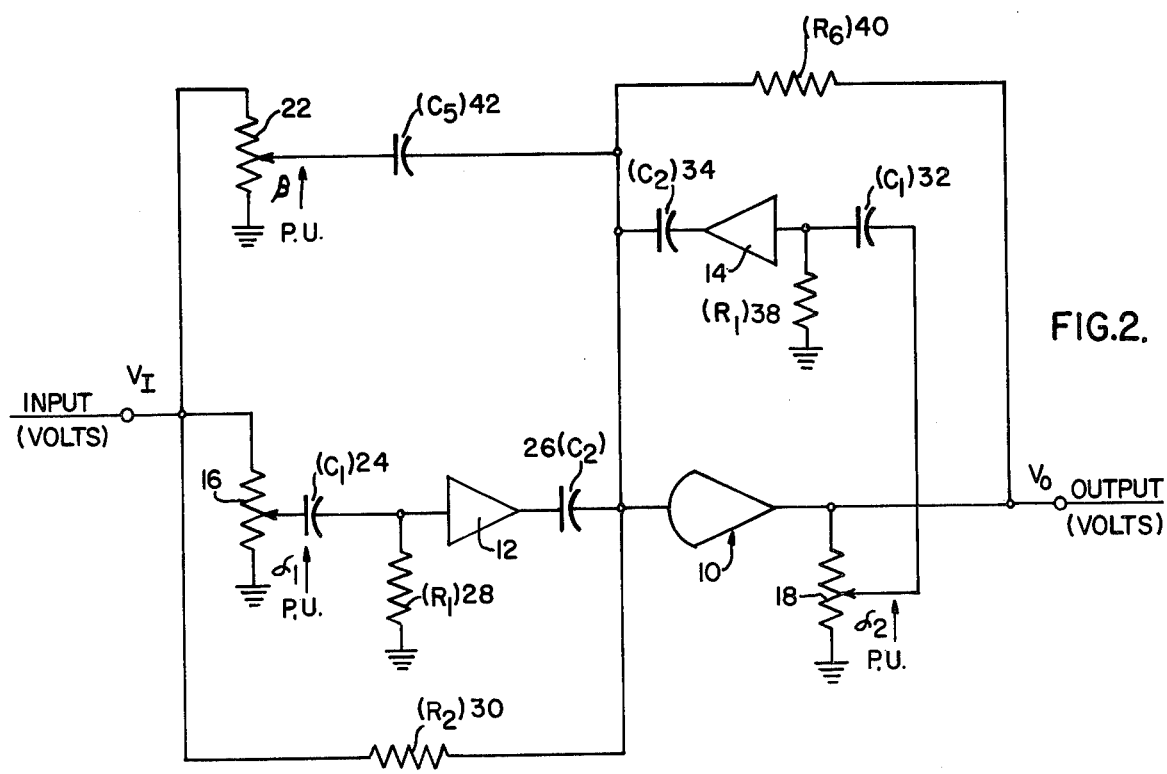
FIG. 2 is a schematic diagram of an active filter adapted as a band-pass filter in accordance with the invention.

The active filter is modified in FIG. 2 to provide a band pass filter i.e. the filter predominately passes one frequency. The change reside in putting the capacitor $C_5$ and the potentiometer 22 in the input to the operational amplifier. The transfer function of the band pass filter (FIG. 2) is:

$$\frac{V_o}{V_I} = \frac{\alpha(R_xC_x)^2S^2 + \beta(R_6C_5)S + 1}{\alpha(R_xC_x)^2S^2 + 1} \quad (45)$$

Similar considerations play a role in the operation of the band pass filter. The setting $\alpha_1$ of potentiometer 16 determines the coefficient of the $S^2$ term in the numerator, the setting $\beta$ of potentiometer 22 determines the coefficient of the s term in the numerator, and the setting $\alpha_2$ of potentiometer 16 determines the coefficient of the $S^2$ term in the denominator.

I claim:

1. An active filter comprising:

an operational amplifier (10) having an input, and an output for delivering a signal $V_o$;

input circuit means for the operational amplifier (10) comprising, a first potentiometer (16), capacitors $C_1$ (24) and $C_2$ (26) resistors $R_1$ (28) and $R_2$ (30), and first impedance isolation means (12), the first potentiometer (16) being connected to a signal source $V_1$, and having a wiper for selecting a voltage portion $\alpha_1$, the wiper being connected to the capacitor $C_1$ (24), said capacitor $C_1$ (24) being connected in parallel with resistor $R_1$ (28), the capacitor $C_2$ (26) being connected to said input, the first impedance isolation means (12) being interposed between the parallel combination $C_1R_1$ (24, 28) and the capacitor $C_2$ (26), the resistor $R_2$ (30) being connected between the signal source $V_I$ and said input;

feedback circuit means for the operational amplifier (10) comprising second (18) and third (20) potentiometers, capacitors $C_3$ (32), $C_4$ (34) and $C_5$ (36), second impedance isolation means (14) and resistors $R_3$ (38) and $R_4$ (40), the second potentiometer (18) being connected to said output and having a wiper for selecting a voltage portion $\alpha_2$, the wiper being connected to said capacitor $C_3$ (32) which is connected in parallel with resistor $R_3$ (38), the capacitor $C_4$ (34) being connected to said input, the second impedance isolation means (14) being interposed between the capacitor $C_4$ (34) and the parallel combination of resistor $R_3$ (38) and capacitor $C_3$ (32), the third potentiometer (20) having a wiper for selecting a voltage portion $\beta$, the wiper being connected to said input through capacitor $C_5$ (36), the resistor $R_4$ (40) being connected between said output and said input, the components having equal magnitudes $C_1=C_3$; $C_2=C_4$; $R_1=R_3$; $R_2=R_4$, the time constants $C_2R_1=C_1R_2=C_xR_x$, and $\alpha_1=\alpha_2=\alpha$ to provide the transfer function:

$$\frac{V_o}{V_I} = \frac{\alpha(R_xC_x)^2S^2 + 1}{\alpha(R_xC_x)^2S^2 + \beta(R_4C_5)S + 1}$$

2. An active filter according to claim 1 wherein said first (12) and second (14) impedance isolation means are emitter followers.

3. An active filter comprising:

an operational amplifier (10) having an input, and an output for delivering a signal $V_o$;

input circuit means for the operational amplifier (10) comprising first (16) and second (22) potentiometers, capacitors $C_1C_2$ (24, 26) and $C_3$ (42), resistors $R_1$ (28) and $R_2$ (30), and first impedance isolation means (12), said first potentiometer (16) being connected to a signal source $V_I$, having a wiper for selecting a voltage portion $\alpha_1$ and being connected to the capacitor $C_1$ (24), said capacitor $C_1$ (24) being connected in parallel with resistor $R_1$ (28), the capacitor $C_2$ (26) being connected to said input, the first impedance isolation means (12) being interposed between the parallel combination $R_1C_1$ (28, 24) and the capacitor $C_2$ (26), the resistor $R_2$ (30) being connected between the signal source $V_I$ and said input, the second potentiometer (22) being connected to the voltage source $V_I$, having a wiper for selecting a voltage portion $\beta$ and being connected to said input through the capacitor $C_3$ (42), feedback circuit means for the operational amplifier comprising a third potentiometer (18), capacitors $C_4$ (32) and $C_5$ (34) and resistors $R_3$ (38) and $R_4$ (40), the third potentiometer (18) being connected to said output, having a wiper for selecting a voltage portion $\alpha_2$, said wiper being connected to said capacitor $C_4$ (32) which is connected in parallel with resistor $R_3$ (38), the capacitor $C_5$ (34) being connected to said input, the second impedance isolation means (14) being interposed between capacitor $C_5$ (32) and the parallel combination $R_3C_4$ (38, 32), the resistor $R_4$ (40) being connected between said output and said input, the components having equal magnitude $C_1=C_4$; $C_2=C_5=C_xR_x$; $R_1=R_3$; $R_2=R_4$, and $\alpha_1=\alpha_2=\alpha$ to provide the transfer function:

$$\frac{V_o}{V_I} = \frac{\alpha(R_xC_x)^2S^2 + \beta(R_2C_3)S + 1}{\alpha(R_xC_x)^2S^2 + 1}$$

4. An active filter according to claim 3 wherein the first (12) and second (14) impedance isolation means are emitter followers.

* * * * *